(12) United States Patent
Takahashi

(10) Patent No.: US 7,072,228 B2
(45) Date of Patent: Jul. 4, 2006

(54) SEMICONDUCTOR MEMORY DEVICE WITH IMPROVED PRECHARGE TIMING

(75) Inventor: Makoto Takahashi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 63 days.

(21) Appl. No.: 10/725,776

(22) Filed: Dec. 1, 2003

(65) Prior Publication Data

US 2004/0136250 A1    Jul. 15, 2004

(30) Foreign Application Priority Data

Nov. 29, 2002  (JP) .............................. 2002-348927

(51) Int. Cl.
*G11C 7/00*    (2006.01)

(52) U.S. Cl. .................................. 365/189.05; 365/203
(58) Field of Classification Search ........... 365/189.05, 365/203, 233, 189.08, 194, 236
See application file for complete search history.

(56) References Cited

U.S. PATENT DOCUMENTS

| 5,463,590 | A  | * | 10/1995 | Watanabe ................... 365/203 |
| 5,959,900 | A  | * | 9/1999  | Matsubara .................. 365/233 |
| 6,240,045 | B1 | * | 5/2001  | Haraguchi et al. .......... 365/233 |
| 6,314,049 | B1 |   | 11/2001 | Roohparvar |
| 6,643,218 | B1 | * | 11/2003 | Chun .......................... 365/233 |
| 6,683,816 | B1 | * | 1/2004  | Emmot et al. .............. 365/233 |
| 6,744,687 | B1 | * | 6/2004  | Koo et al. ................... 365/233 |

FOREIGN PATENT DOCUMENTS

| JP | 2000-035159 | 2/2001 |
| JP | 2002-170398 | 6/2002 |

* cited by examiner

*Primary Examiner*—Trong Phan
(74) *Attorney, Agent, or Firm*—DLA Piper Rudnick Gray Cary US LLP

(57) ABSTRACT

A memory cell array has a plurality of memory cells arranged in row and columns, and bit lines and word lines connected to the memory cells. A command buffer circuit receives at least an active signal to activate one of the rows, and a clock signal, and generates an internal precharge signal to precharge the bit lines based on the active signal.

9 Claims, 5 Drawing Sheets

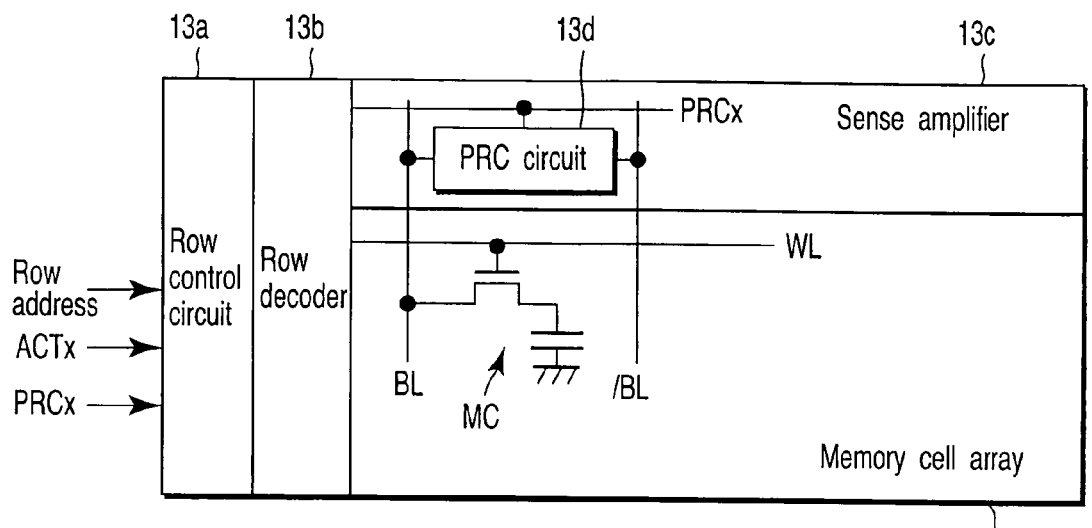
F I G. 3A
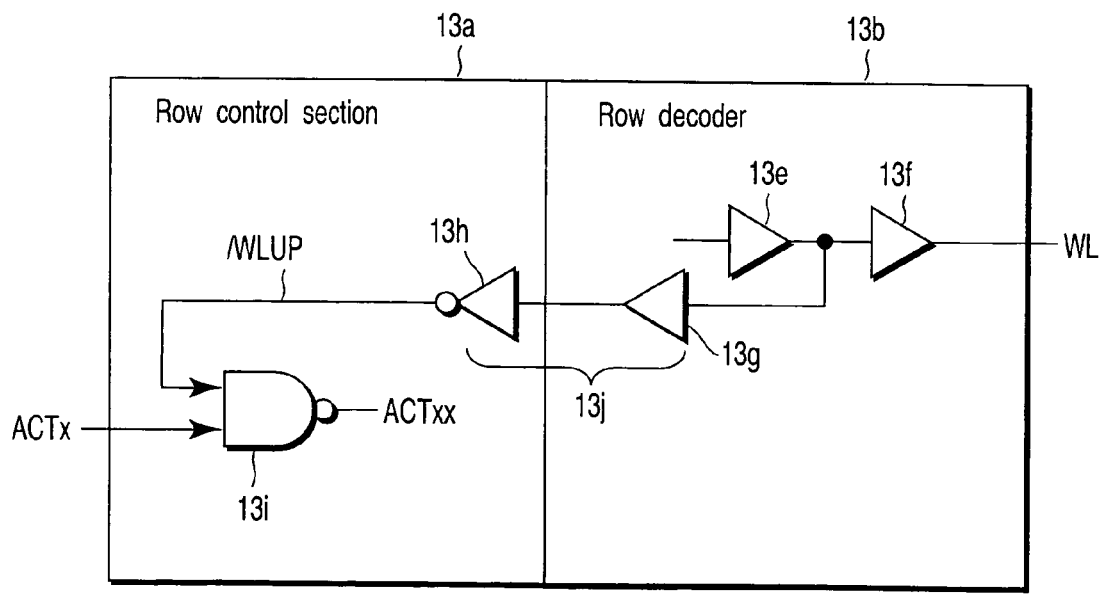
F I G. 3B

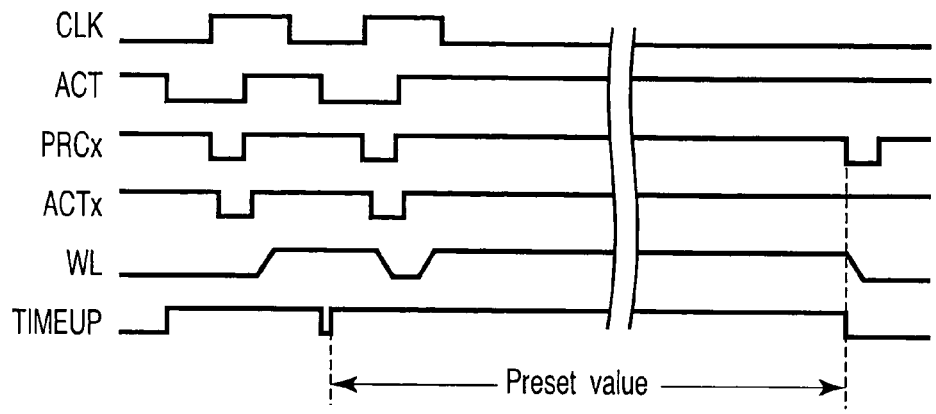
F I G. 8

SEMICONDUCTOR MEMORY DEVICE WITH IMPROVED PRECHARGE TIMING

CROSS-REFERENCE TO RELATED APPLICATIONS

This application is based upon and claims the benefit of priority from the prior Japanese Patent Application No. 2002-348927, filed Nov. 29, 2002, the entire contents of which are incorporated herein by reference.

BACKGROUND OF THE INVENTION

1. Field of the Invention

This invention relates to a semiconductor memory device, such as a dynamic random access memory (DRAM), in particular, precharge thereof.

2. Description of the Related Art

A DRAM receives an external command signal for precharging bit lines with word lines inactivated generally, that is, a precharge command signal. Therefore, the DRAM has a pin or a pad which receives precharge command signals.

Conventional DRAM has an address buffer circuit, a command buffer circuit, and a memory cell array in which a plurality of memory cells are arranged in rows and columns. The address buffer circuit receives an address signal, and outputs an internal address signal. The command buffer circuit receives a precharge command signal, an active command signal, a refresh command signal, and a write/read command signal in accordance with a clock signal, and outputs an internal precharge command signal, an internal active command signal, an internal refresh command signal, and an internal write/read command signal corresponding to the respective received command signals. The precharge command signal is a command for performing precharge of bit lines, and the active command signal is a command for activating the rows. The refresh command signal is a command for performing refresh of the memory cells, and the write/read command is a command for performing writing/reading of data. The memory cell array receives an internal address signal from the address buffer circuit in response to each of the internal command signals supplied from the command buffer circuit, selects a required memory cell, and performs an operation such as writing or reading of data.

As described above, the DRAM receives various command signals in accordance with a clock signal CLK. Among the command signals, a precharge command signal PRC is important for in timing control in the DRAM.

In the meantime, with increase in the operation speed of the DRAM, it becomes difficult, for lack of time, to input all external commands in accordance with a clock signal CLK.

Specifically, as shown in FIG. 9, if time tRC from an active command signal ACT to the next active command signal ACT is sufficiently longer than a cycle of the clock signal CLK, the DRAM has a sufficient time to operate. Therefore, the DRAM can receive a precharge command PRC between the active command signal ACT and the next active command signal ACT.

However, as shown in FIG. 10, if the time tRC is relatively short with respect to the cycle of the clock signal CLK, it is difficult to externally input the precharge command signal PRC in the DRAM. In FIGS. 9 and 10, WL[0] shows an operation of a selected word line.

Therefore, it has been considered controlling precharge timing inside the DRAM, without externally inputting a precharge command signal PRC. However, as shown in FIG. 10, it is necessary to automatically control to start precharge between an active command signal ACT and the next active command signal ACT. Although a timer is required to perform such a control, it is difficult to manufacture a timer having a high accuracy. Therefore, it is difficult to accurately control precharge start timing, and it is desired to provide a semiconductor memory device which can accurately control the precharge timing.

BRIEF SUMMARY OF THE INVENTION

According to a first aspect of the invention, there is provided a semiconductor memory comprising: a memory cell array having a plurality of memory cells arranged in rows and columns, and bit lines and word lines connected to the memory cells; and a command buffer circuit, which receives at least an active signal to activate one of the rows, and a clock signal, the command buffer circuit generating an internal precharge signal to precharge the bit lines based on the active signal.

According to a second aspect of the invention, there is provided a semiconductor memory device comprising: a memory cell array having a plurality of memory cells arranged in rows and columns, and bit lines and word lines connected to the memory cells; a command buffer circuit, which receives at least an active signal to activate one of the rows, and a clock signal, the command buffer circuit generating an internal active signal based on the active signal; and a control circuit which generates an internal precharge signal to precharge the bit lines in response to the active signal outputted from the command buffer circuit, the control circuit controls a time in which one of the word lines is kept selected.

BRIEF DESCRIPTION OF THE SEVERAL VIEWS OF THE DRAWING

FIG. 3A is a diagram schematically showing a memory cell array and peripheral circuit shown in FIG. 1;

FIG. 3B is a circuit diagram schematically illustrating a main part of FIG. 3A;

FIG. 8 is a timing chart illustrating an operation of the circuit illustrated in FIG. 7;

DETAILED DESCRIPTION OF THE INVENTION

Embodiments of the present invention will now be described with reference to drawings.

(First Embodiment)

FIGS. 1–5 illustrate a first embodiment of the present invention. The first embodiment is characterized in that a precharge command signal is not externally taken, but generated in a command buffer circuit in synchronism with an active command signal ACT. Therefore, this DRAM has neither a pin nor a pad for receiving a precharge command signal from the outside. Further, it is characterized in that an operation cycle of the DRAM starts with precharge.

Figure 1:
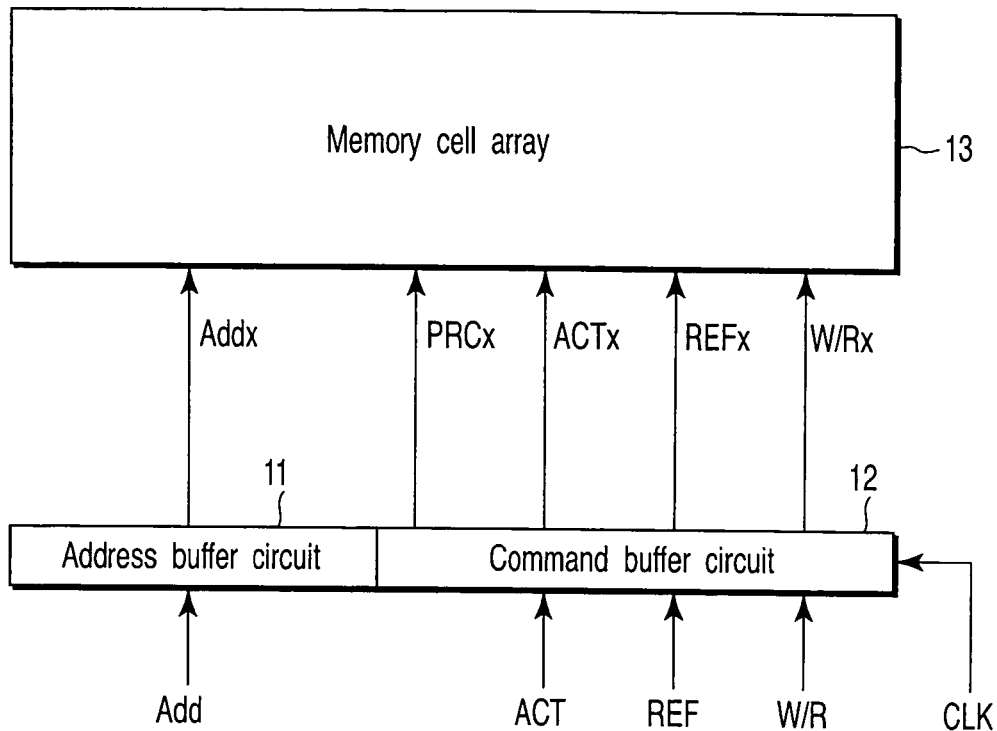
FIG. 1 is a block diagram schematically illustrating a semiconductor memory device according to a first embodiment of the present invention.

FIG. 1 schematically illustrates a structure of a DRAM according to the first embodiment. The DRAM comprises an address buffer circuit 11, a command buffer circuit 12, and a memory cell array 13. The address buffer circuit 11 receives an address signal Add, and outputs an internal address signal Addx. The command buffer circuit 12 receives an active command signal ACT, a refresh command signal REF, and write/read command signal W/R from the outside, in accordance with a clock signal CLK. The command buffer circuit 12 generates an internal precharge command signal PRCx and an internal active command signal ACTx, in response to the active command signal ACT. The command buffer circuit 12 also generates an internal refresh command signal REFx and an internal write/read command signal W/Rx, in response to the refresh command signal REF and the write/read command signal W/R, respectively. The memory cell array 13 has a structure in which a plurality of memory cells are arranged in rows and columns. The memory cell array 13 selects one of the memory cells, in response to the precharge command signal PRC and each of the internal command signals fed from the command buffer circuit 12 and the address signal from the address buffer circuit 11, and performs an operation, such as data writing or reading, with respect to the selected cell.

Figure 2:
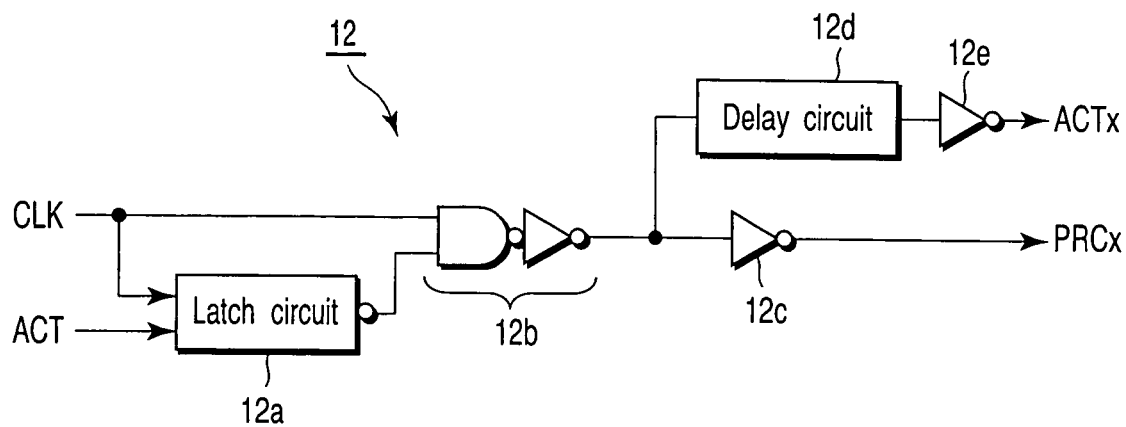
FIG. 2 is a circuit diagram illustrating a part of a command buffer circuit illustrated in FIG. 1.

FIG. 2 illustrates a part of the command buffer circuit 12, which is a part of generating the internal precharge command signal PRCx and the internal active command signal ACTx. In FIG. 2, an active command signal ACT and a clock signal CLK externally supplied are supplied to a latch circuit 12a. The latch circuit 12a latches the active command signal ACT in accordance with the clock signal CLK, and outputs an inverted signal of the active command signal. The output signal of the latch circuit 12a and the clock signal CLK are supplied to a logic circuit 12b. The logic circuit 12b is formed of, for example, a series circuit comprising a NAND circuit and an inverter circuit. An output signal of the logic circuit 12b is supplied to an inverter circuit 12c, and an internal precharge command signal PRCx is outputted from an output end of the inverter circuit 12c. Further, the output signal of the logic circuit 12b is successively fed to a delay circuit 12d having a predetermined delay time, and an inverter circuit 12e. The inverter circuit 12e outputs an internal active command signal ACTx. Therefore, the internal active command signal ACTx is delayed by the delay time of the delay circuit 12d behind the internal precharge command signal PRCx.

FIG. 3A illustrates the memory cell array 13 and peripheral circuits thereof. A row control section 13a, a row decoder 13b and a sense amplifier 13c are arranged around the memory cell array 13.

The row control section 13a receives a row address signal from the address buffer circuit 1, and the internal active command signal ACTx and the internal precharge command signal PRCx from the command buffer circuit 2. The row decoder 13b decodes the row address signal supplied from the row control section 13a, and selects a required word line WL.

The word line WL is connected with a memory cell MC formed of a transistor and a capacitor. A precharge (PRC) circuit 13d is connected between the bit lines BL and /BL. The precharge circuit 13d precharges bit lines BL and /BL (the mark "/" denotes an inverted signal) with a voltage of ½ of a power source voltage VDD. The sense amplifier 13c detects potentials of the bit lines BL and /BL.

FIG. 3B schematically illustrates the structures of the row control section 13a and the row decoder 13b. The row decoder 13b includes drivers 13e and 13f, which are connected in series. The drive 13e receives an output signal of a decoding circuit (not shown), and the driver 13f drives the word lines in response to an output signal of the decoding circuit.

The row control section 13a controls to activate a word line corresponding to a new address, after the word line WL becomes unselected (low level) by the precharge operation. Specifically, the row control section 13a is provided with a NAND circuit 13i, and the internal active command signal ACTx and a word-line monitor signal /WLUP are supplied to an input end of the NAND circuit 13i. The word-line monitor signal /WLUP is a signal which becomes active when any of the word lines is selected and at a high level, and monitors end of precharge. The word-line monitor signal /WLUP is generated by a generating circuit 13j connected with the row decoder 13b. The generating circuit 13j comprises a driver 13g, and an inverter circuit 13h connected to the driver 13g. An input end of the driver 13g is connected between the drivers 13e and 13f of the row decoder 13b. The word-line monitor signal /WLUP is outputted from an output end of the inverter circuit 13h. Therefore, the word-line monitor signal /WLUP is changed to low level when the word line is selected and changed to high level, and thereby indicates end of precharge. Further, when the word line becomes unselected and changes to low level, the word-line monitor signal is changed to high level. The generating circuit of the word-line monitor signal /WLUP is not limited to the above structure.

An output signal ACTxx of the NAND circuit 13i is at high level, when the internal active command signal ACTx is at low level and the word-line monitor signal /WLUP is at high level, that is, in a precharge period. In response to the signal ACTxx, a word line corresponding to a new address is activated, and writing or reading of data is performed.

Figure 4:
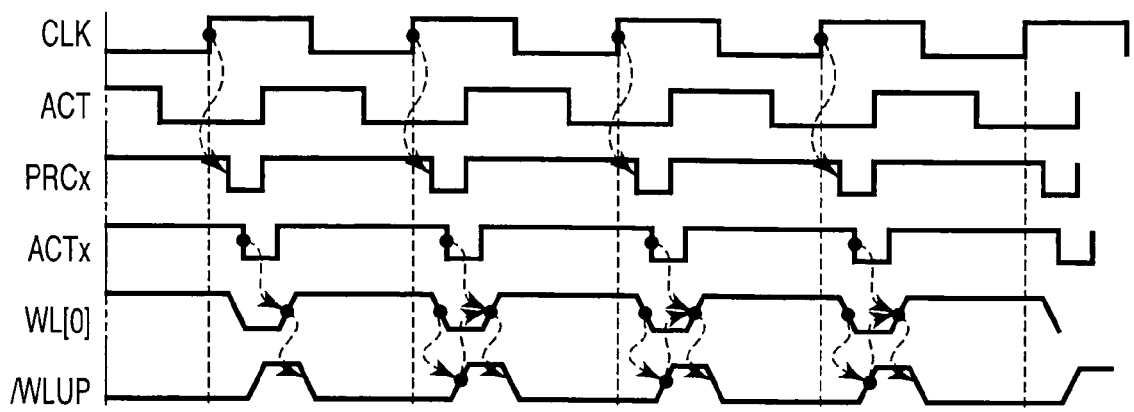
FIG. 4 is a timing chart illustrating an operation of a command buffer circuit illustrated in FIG. 2.

FIG. 4 illustrates an operation of the command buffer circuit 12 shown in FIG. 2. As shown in FIG. 4, when a precharge command signal PRCx is generated in response to the active command signal ACT, precharge is instantly started in response to the precharge command signal. A word line WL is inactivated when precharge is started, and the word line WL is activated when precharge is ended. The word-line monitor signal /WLUP monitors activation of the word line, that is, end of precharge. When the end of precharge is detected, a word line required in the cycle is activated, and the word-line monitor signal /WLUP indicates activation of the word line. Further, in the next cycle of the clock signal CLK, operation starts with precharge.

Figure 5:
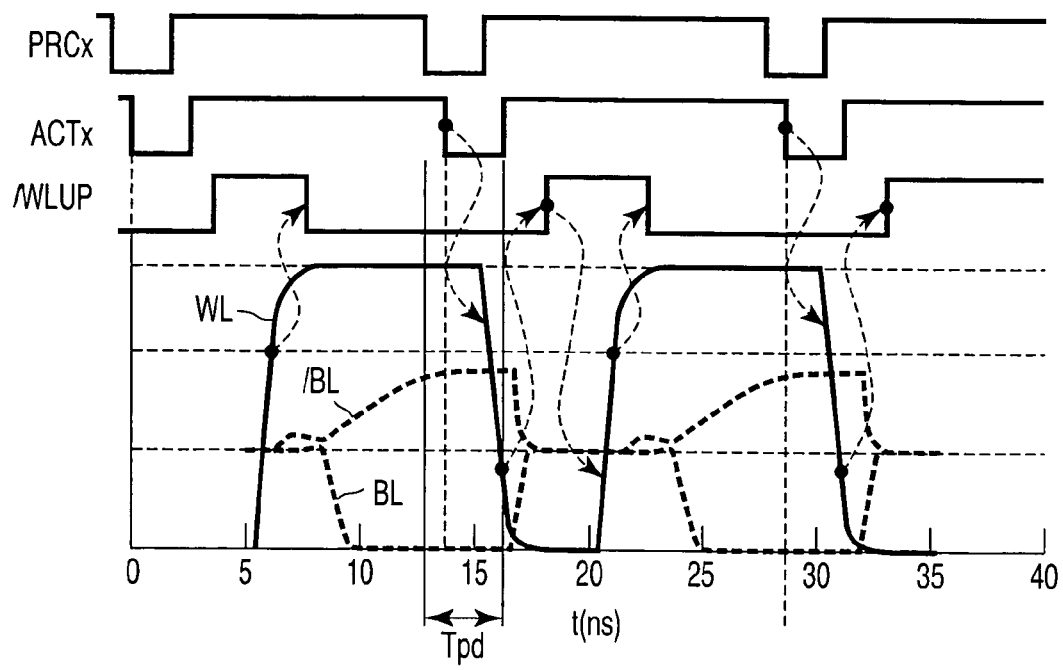
FIG. 5 is a timing chart illustrating an operation of the circuit illustrated in FIG. 3 in reading of data.

FIG. 5 illustrates an operation in reading of data. The horizontal axis shows time in nanoseconds (t(ns)). When precharge is performed in response to the precharge command signal PRCx, the bit lines BL and /JBL are precharged with a voltage of VPD/2, for example. In this state, if the word line WL is selected, the word-line monitor signal /WLUP changes to low level, and the potentials of the bit lines BL and /BL change according to data stored in the memory cell. The sense amplifier 13c senses and amplifies the potentials of the bit lines BL and /BL. Thereafter, precharge is performed by a precharge command signal PRCx of the next cycle. Further, when the internal active command signal ACTx changes to low level, the word line WL is rendered unselected. Precharge of the bit lines and decoding of the row address are performed in a period Tpd in which the precharge command signal PRCx and the internal active command signal ACTx are at low level.

According to the first embodiment, the internal precharge signal PRCx is generated according to the active command signal ACT. Therefore, even if the frequency of the clock signal CLK rises, the internal precharge signal PRCx can be reliably generated.

Further, both the internal precharge signal PRCx and the internal active command signal ACTx can be generated from one active command signal ACT supplied from the outside. Therefore, there is no need to supply a precharge command signal from the outside, thus no pin or pad is required for receiving a precharge command signal.

Furthermore, the internal active command signal ACTx is slightly delayed behind the internal precharge signal PRCx. The internal active command signal ACTx is supplied to the row control section 13a after precharge of the bit lines has been completed in response to the word-line monitor signal /WLUP. Actual writing or reading is started in response to the internal active command signal ACTx. This enables a reliable operation, even if an accelerated clock signal is used.

Further, precharge of the bit lines and decoding of the row address are performed almost simultaneously, in the period Tpd in which the internal precharge command signal PRCx and the internal active command signal ACTx are at low level. This enables high-speed operation.

(Second Embodiment)

Figure 6:
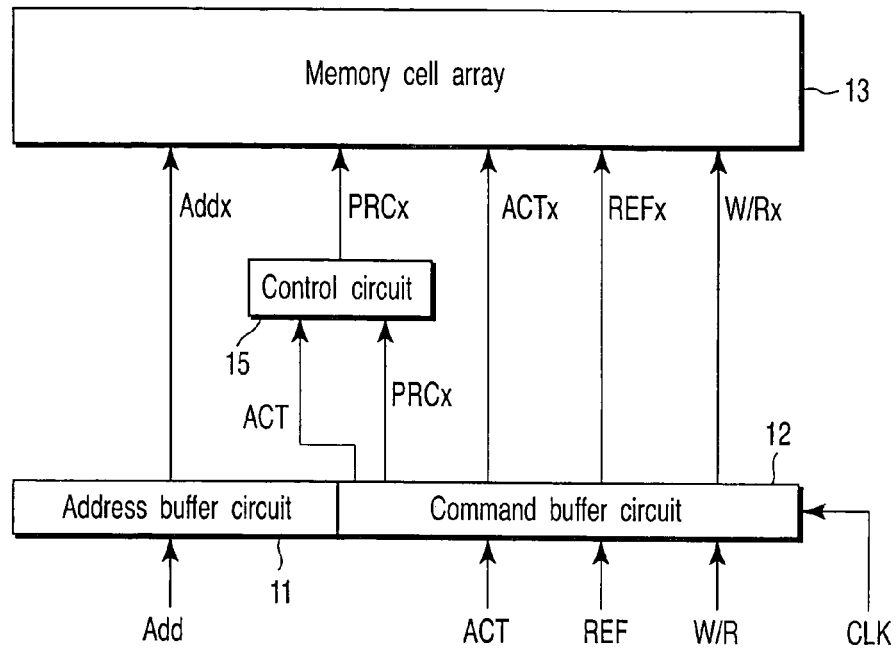
FIG. 6 is a block diagram illustrating a second embodiment of the present invention.

FIG. 6 illustrates a second embodiment of the present invention.

In the first embodiment, an active cycle is started with a precharge operation. However, if an active command signal ACT is not supplied from the outside after the last active cycle has ended, the time elapsed before the next precharge may be very long. In such a case, the word line selected last is maintained at the selected state. If the word line is left selected for a long time, the transistor deteriorates and the reliability of the memory device is lowered. Therefore, the second embodiment sets a limit to the maximum length of the time during which a word line is kept selected.

FIG. 6 illustrates the second embodiment, in which the same reference numerals as those used in the first embodiment denote the same constituent element as those in the first embodiment. In FIG. 6, an active command signal ACT and an internal precharge command signal PRCx outputted from a command buffer circuit 12 are supplied to a control circuit 15. The control circuit 15 limits the maximum length of the time in which a word line is kept selected, and generates an internal precharge command signal PRCx if a word line is kept selected for a long time. Specifically, the control circuit 15 generates a precharge command signal PRCx, if no active command signal ACT is supplied to the command buffer circuit 12 for a predetermined period of time. Further, if an active command signal ACT is supplied to the command buffer circuit 12 within a set period of time, the control circuit 15 gives high priority to the active command signal, and starts precharge and perform active operation.

Figure 7:
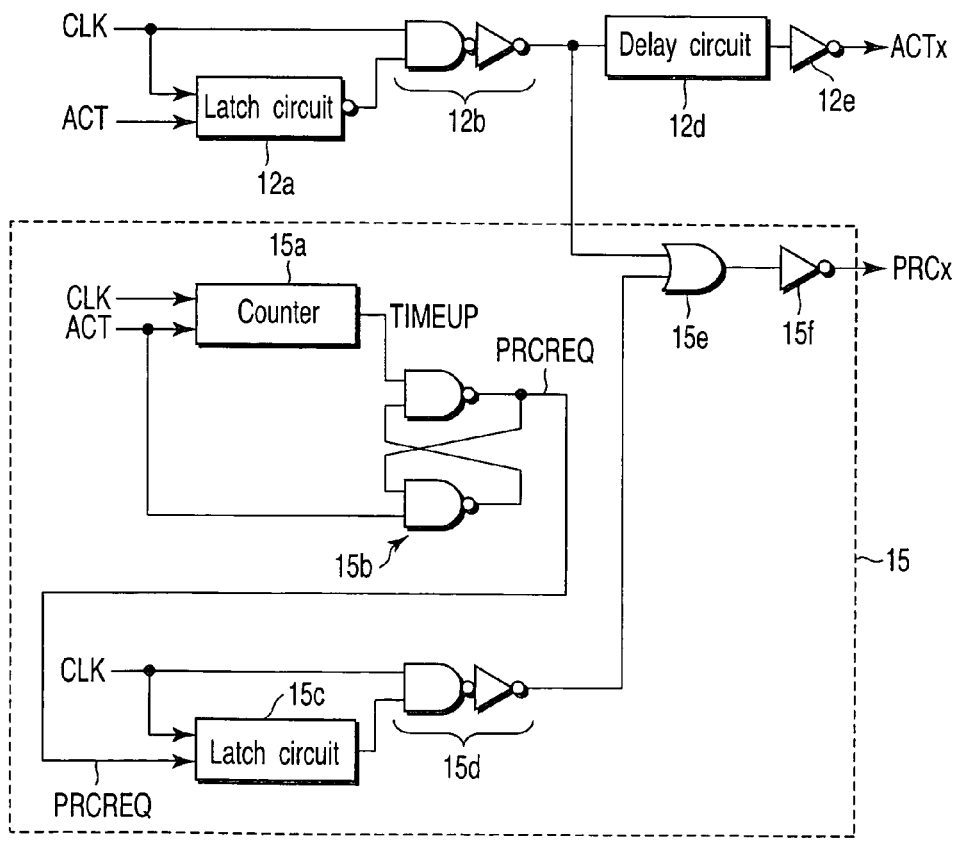
FIG. 7 is a circuit diagram illustrating an example of a control circuit illustrated in FIG. 6.
Figure 9:
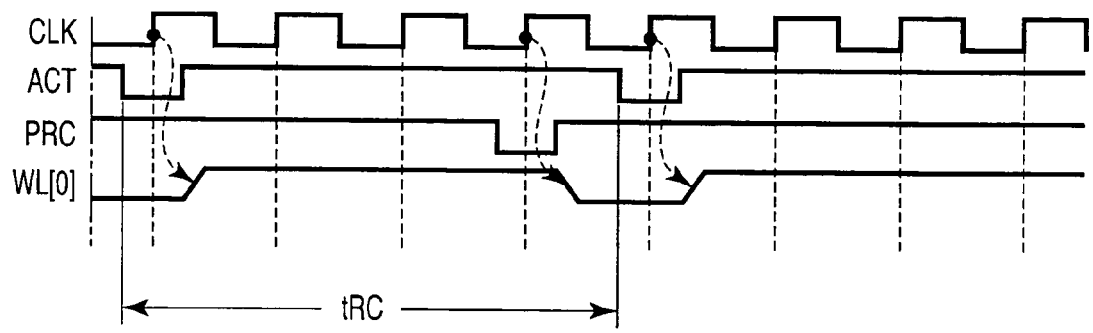
FIG. 9 is a timing chart illustrating an operation of a conventional DRAM.
Figure 10:
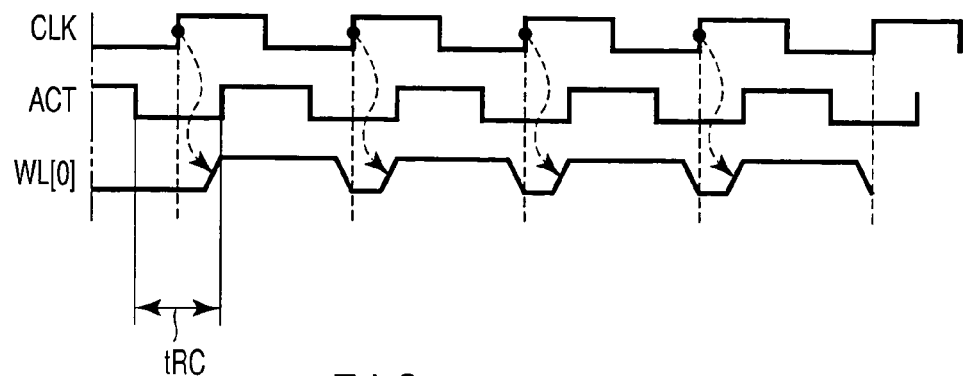
FIG. 10 is a timing chart illustrating another operation of a conventional DRAM.

FIG. 7 is a diagram illustrating an example of the structure of the control circuit 15. The same reference numerals are assigned to the same constituent elements as those in FIG. 2, and only elements different from those in FIG. 2 will now be explained.

An active command signal ACT outputted from the command buffer circuit 12 is supplied to, for example, a counter 15a, together with a clock signal CLK. The counter 15a counts a selected time of a word line, and counts the clock signal CLK in response to the active command signal ACT. Specifically, the counter 15a is a so-called preset counter. A value corresponding to the maximum selected time of a word line is preset in the counter 15a, and the counter 15a generates an output signal TIMEUP when a counted value reaches the preset value. The output signal TIMEUP is supplied to one input end of a flip-flop circuit 15b. The other input end of the flip-flop circuit 15b is supplied with the active command signal ACT. The flip-flop circuit 15b is set by the output signal TIMEUP of the counter 15a, and reset by the active command signal ACT. The set output signal of the flip-flop circuit 15b is supplied as a precharge request signal PRCREQ to a latch circuit 15c, together with the clock signal CLK. An output signal of the latch circuit 15c is supplied to a logic circuit 15d, together with the clock signal CLK. An output signal of the logic circuit 15d is supplied to an OR circuit 15e, together with an output signal of a logic circuit 12b. An output signal of the OR circuit 15e is outputted as an internal precharge command signal PRCx, through an inverter circuit 15f.

Operation of the control circuit 15 will now be explained with reference to FIG. 8. When the command buffer circuit 12 receives an active command signal ACT and the signal is outputted from the logic circuit 12b through the latch circuit 12a, as described above, an internal precharge command signal PRCx and an internal active command signal ACTx delayed slightly behind the internal precharge command signal are outputted. Simultaneously, an active command signal ACT outputted from the command buffer circuit 12 resets the flip-flop circuit 15b, and the counter 15a starts a counting operation. If the next active command signal ACT is supplied during the counting operation, the counter 15a is reset, and a counting operation is repeated from the start.

In the meantime, if the counted value of the counter 15a reaches the preset value, the flip-flop circuit 15b is set, and outputs a precharge request signal PRCREQ at high level. The signal PRCREQ is supplied to the inverter circuit 15f through the latch circuit 15c, the logic circuit 15d and the OR circuit 15e, and the inverter circuit 15f outputs an internal precharge command signal PRCx. Therefore, the selected word line is rendered unselected, and a precharge operation is performed.

According to the second embodiment, the control circuit 15 can reliably generate the internal precharge command signal PRCx and the internal active command signal ACTx, in response to the active command signal ACT supplied from the outside. Further, if the interval between an active command signal and the next active command signal is longer than a preset time, the control circuit 15 automatically generates an internal precharge command signal PRCx to perform a precharge operation, and renders the selected word line unselected. Therefore, it can prevent deterioration of the transistor, and improve the reliability of the memory device.

In the second embodiment, the control circuit 15 is formed by using the counter 15a. However, the invention is not limited to it, but it is possible to form the control circuit by using a preset timer.

Further, the above embodiments are explained about the cases where the present invention is applied to a DRAM. However, each of the embodiments is not limited to applications for a DRAM, but can be applied to any memory device which precharges bit lines.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a memory cell array having a plurality of memory cells arranged in rows and columns, and bit lines and word lines connected to the memory cells;
   a command buffer circuit, which receives at least an active signal to activate one of the rows, and a clock signal, the command buffer circuit generating an internal precharge signal to precharge the bit lines based on the active signal;
   a latch circuit to which the clock signal and the active signal are supplied, the latch circuit latching the active signal in response to the clock signal;
   a logic circuit to which the active signal latched by the latch circuit and the clock signal are supplied, the logic circuit generating the internal precharge signal; and
   a delay circuit which delays the internal precharge signal supplied from the logic circuit, and generates an internal active signal.

2. The device according to claim 1, further comprising:
   a precharge circuit connected to the bit lines of the memory cell array, the precharge circuit precharging the bit lines in response to the precharge signal.

3. The device according to claim 1, wherein the memory cell array constitutes a DRAM.

4. A semiconductor memory device comprising:
   a memory cell array having a plurality of memory cells arranged in rows and columns, and bit lines and word lines connected to the memory cells;
   a command buffer circuit, which receives at least an active signal to activate one of the rows, and a clock signal, the command buffer circuit generating an internal precharge signal to precharge the bit lines based on the active signal;
   a detection circuit which monitors a potential of a word line, and detects a precharge period of said word line; and
   a logic circuit which activates a word line of the word lines, in response to the active signal and a detection output signal of the detection circuit.

5. A semiconductor memory device comprising:
   a memory cell array having a plurality of memory cells arranged in rows and columns, and bit lines and word lines connected to the memory cells;
   a command buffer circuit, which receives at least an active signal to activate one of the rows, and a clock signal, the command buffer circuit generating an internal active signal based on the active signal;
   a control circuit which generates an internal precharge signal to precharge the bit lines in response to the active signal outputted from the command buffer circuit, the control circuit controls a time in which one of the word lines is kept selected;
   wherein the command buffer circuit further includes:
   a latch circuit to which the clock signal and the active signal are supplied, the latch circuit latching the active signal in response to the clock signal;
   a logic circuit to which the active signal latched by the latch circuit and the clock signal are supplied, the logic circuit generating the internal precharge signal; and
   a delay circuit which delays the internal precharge signal supplied from the logic circuit, and generates an internal active signal.

6. The device according to claim 5, the control circuit comprising:
   a counter which counts the clock signal in response to the active signal, the counter outputs a signal when it counts the clock signal to a preset value;
   a flip-flop circuit which is reset in response to the active signal, and set in response to the signal outputted from the counter; and
   a generating circuit which generates the internal precharge signal when the flip-flop circuit is set.

7. The device according to claim 5, further comprising:
   a precharge circuit connected to the bit lines of the memory cell array, the precharge circuit precharging the bit lines in response to the precharge signal.

8. The device according to claim 5, wherein the memory cell array constitutes a DRAM.

9. The device according to claim 5, further comprising:
   a detection circuit which monitors a potential of a word line, and detects a precharge period of said word line; and
   a logic circuit which activates a word line of the word lines, in response to the active signal and a detection output signal of the detection circuit.

* * * * *